United States Patent
Jung

(10) Patent No.: US 7,785,483 B2
(45) Date of Patent: Aug. 31, 2010

(54) EXPOSURE MASK AND METHOD FOR FABRICATING SEMICONDUCTOR DEVICE USING THE SAME

(75) Inventor: Yong Soon Jung, Guro-gu (KR)

(73) Assignee: Hynix Semiconductor Inc., Icheon-si (KR)

( * ) Notice: Subject to any disclaimer, the term of this patent is extended or adjusted under 35 U.S.C. 154(b) by 419 days.

(21) Appl. No.: 11/771,475

(22) Filed: Jun. 29, 2007

(65) Prior Publication Data

US 2008/0153277 A1    Jun. 26, 2008

(30) Foreign Application Priority Data

Dec. 22, 2006    (KR) .................. 10-2006-0132600

(51) Int. Cl.
*B44C 1/22*    (2006.01)
*G03F 1/00*    (2006.01)
(52) U.S. Cl. ........................... 216/41; 430/5

(58) Field of Classification Search .............. 216/41; 430/5
See application file for complete search history.

(56) References Cited

U.S. PATENT DOCUMENTS

| | | | |
|---|---|---|---|
| 6,617,080 B1* | 9/2003 | Kawachi et al. ............. 430/5 |
| 2006/0003235 A1* | 1/2006 | Sugimoto ................... 430/5 |
| 2006/0105249 A1* | 5/2006 | Kushida et al. ............. 430/5 |
| 2006/0121362 A1* | 6/2006 | Yim .......................... 430/5 |

* cited by examiner

*Primary Examiner*—Shamim Ahmed
(74) *Attorney, Agent, or Firm*—Marshall, Gerstein & Borun LLP

(57) ABSTRACT

An exposure mask for recess gate includes a transparent substrate and a recess gate pattern. The recess gate pattern is disposed over the transparent substrate. The recess gate pattern includes a first portion having a first line width and a second portion having a second line width smaller than the first line width. In the second portion, elements of the recess gate pattern are separated.

6 Claims, 9 Drawing Sheets

EXPOSURE MASK AND METHOD FOR FABRICATING SEMICONDUCTOR DEVICE USING THE SAME

CROSS-REFERENCE TO RELATED APPLICATION

The priority of Korean patent application number 10-2006-00132600, filed on Dec. 22, 2006, which is incorporated by reference in its entirety, is claimed.

BACKGROUND

The invention relates generally to a method for fabricating a semiconductor device. More particularly, the invention relates to a method for fabricating a semiconductor device using an exposure mask.

As design rules of semiconductor devices have been radically reduced, gate resistance values of cell transistors increases. As a result, there is a limit to a planar transistor structure with respect to the gate resistance and threshold voltage. Methods for securing a channel length without an increase in design rules have been studied. In order to expand the channel length while maintaining a low critical dimension ("CD") of a gate, recess channel structures have been researched. In the recess channel structure, a semiconductor substrate is recessed, and a gate is formed over the recessed semiconductor substrate to extend an effective channel length.

FIGS. 1 and 2 are views illustrating a prior art method for fabricating a semiconductor device. A device isolation structure 12 that defines an active region 14 is formed over a semiconductor substrate 10. A portion of active region 14 is etched by a photolithography process with a line-type mask pattern (not shown) to form a recess region 16. A gate oxide film (not shown) is formed over active region 14 and in recess region 16. A gate polysilicon layer (not shown), a tungsten layer (not shown), and a gate hard mask layer (not shown) are sequentially formed over active region 14 and recess region 16. The gate hard mask layer, the tungsten layer, and the gate polysilicon layer are patterned by a photolithography process with a gate mask, to form a recess gate (not shown).

Due to the high level integration in semiconductor devices, the critical dimension ("CD") and process margin of active region 14 in its longitudinal direction are lacking as shown in FIG. 2. When recess region 16 is formed, the edge of neighboring active region 14 is damaged at location "A," which causes a device malfunction.

SUMMARY

Embodiments consistent with the invention relate to an exposure mask for a recess gate. The exposure mask includes a recess gate pattern having a sufficient margin between an edge of an active region and a neighboring recess region, thereby preventing damage generated in the edge of the active region when the recess region is formed to improve the characteristics of a device.

According to one embodiment, an exposure mask for forming a recess gate on a semiconductor substrate having a plurality of active regions includes a transparent substrate, and a recess gate pattern including a plurality of gate lines disposed over the transparent substrate, the recess gate pattern including a first portion having a first line width and a second portion having a second line width smaller than the first line width. In a second portion, adjacent elements of the recess gate pattern are separated by a distance t, where $0<t<1/5F$ and F is a distance between two neighboring gate lines.

According to another embodiment, a method for fabricating a semiconductor device includes the steps of: forming a photoresist film over a semiconductor substrate having a device isolation structure defining an active region; exposing and developing the photoresist film by using a recess gate mask to form a photoresist pattern; selectively etching the semiconductor substrate by using the photoresist pattern to form a recess region; removing the photoresist pattern; and forming a recess gate over the semiconductor substrate. The recess gate mask includes a recess gate pattern including a first portion having a first line width and a second portion having a second line width smaller than the first line width, wherein in the second portion, adjacent elements of the recess gate pattern are separated.

According to another embodiment, a method for fabricating a semiconductor device includes the steps of: providing a semiconductor substrate having a device isolation structure defining an active region; and selectively etching the semiconductor substrate by using the above described exposure mask to form a recess region.

According to another embodiment, an exposure mask for forming recess gate on a semiconductor substrate includes an isolated recess gate pattern with at least one of projecting part on at least one side along the minor axis thereof.

DETAILED DESCRIPTION

Figure 1:
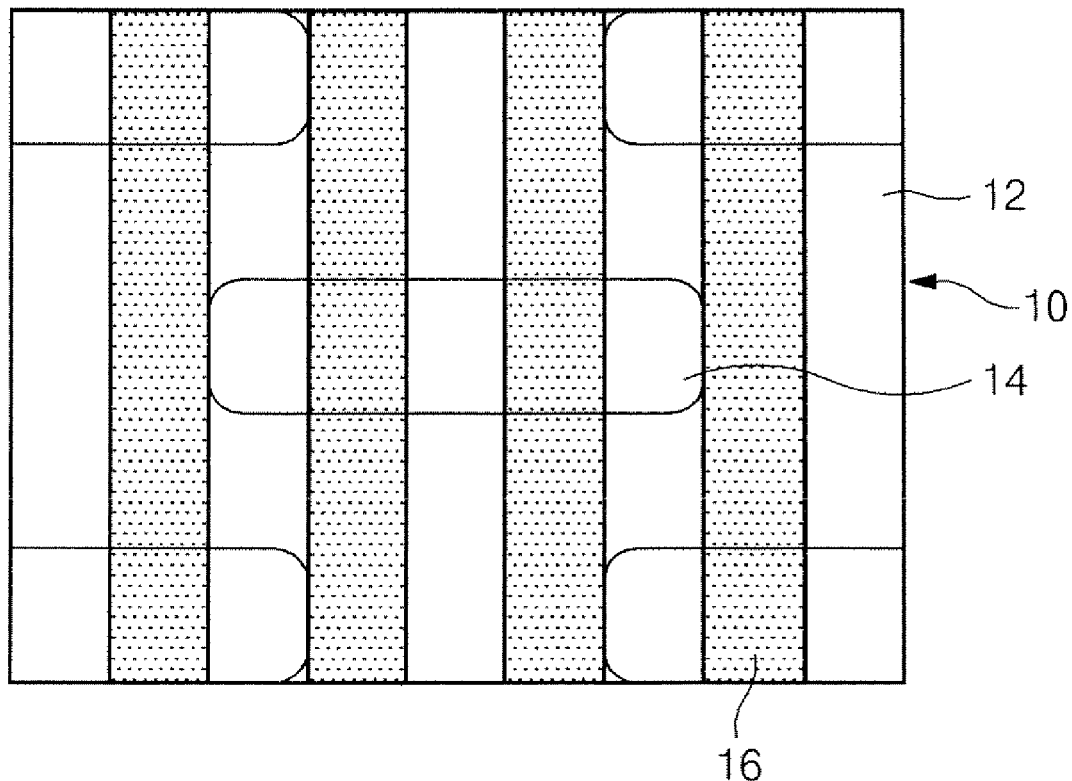
FIGS. 1 and 2 are views illustrating a method for fabricating a semiconductor device.
Figure 2:
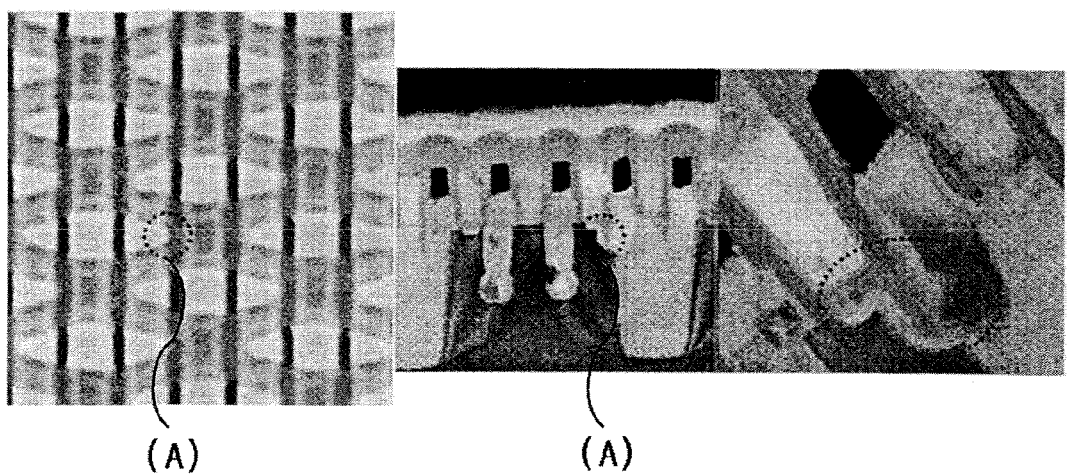
Figure 3:
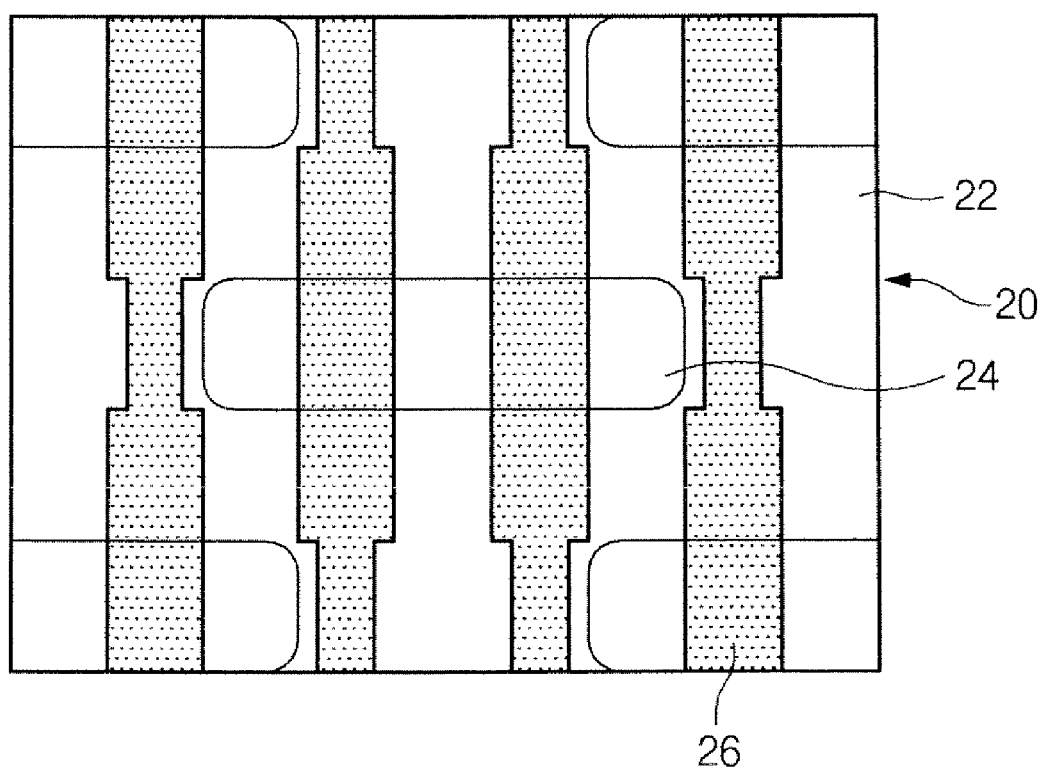
FIG. 3 is a layout illustrating an exposure mask according to an embodiment consistent with the invention.
Figure 4:
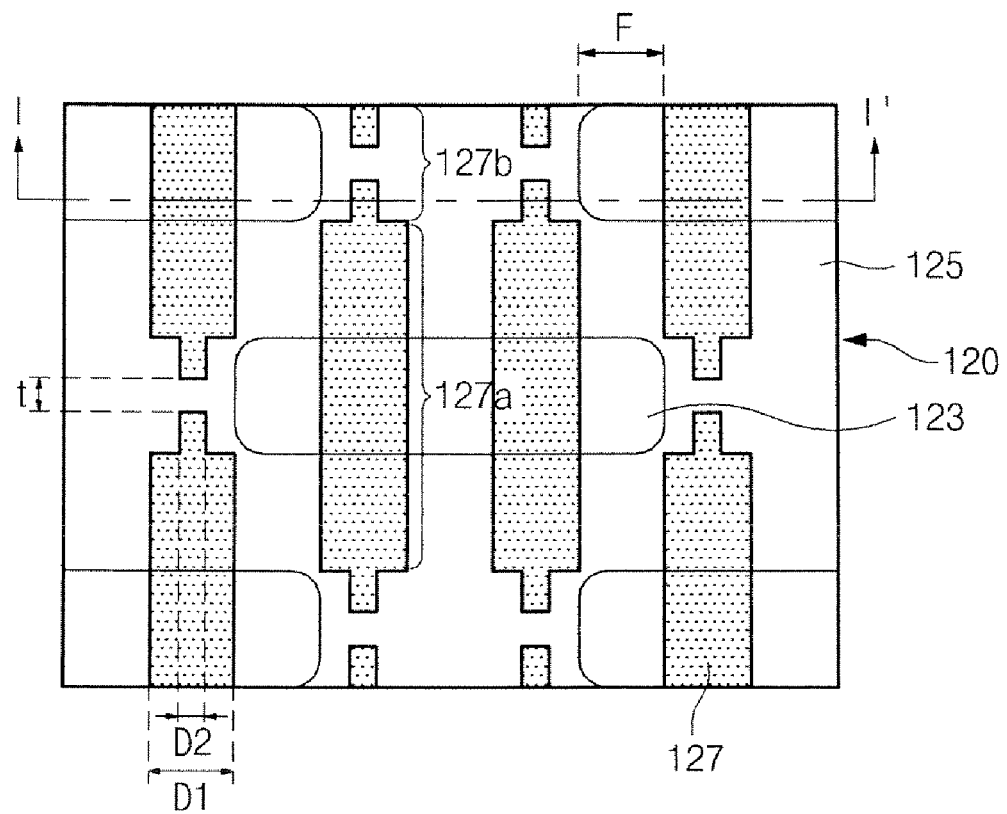
FIG. 4 is a layout illustrating an exposure mask according to another embodiment consistent with the invention.

FIG. 4 is a layout illustrating an exposure mask according to an embodiment consistent with the invention. A device isolation structure 22 is formed in a semiconductor substrate 20 to define an active region 24. A portion of active region 24 is etched by a photolithography process with a waved mask pattern (not shown) to form a recess gate region 26. In recess gate region 26, the CD of a portion near an edge of the active region 24 is 4 nm less than that of the rest of recess gate region 26. A gate oxide film (not shown) is formed over active region 24 and semiconductor substrate 20 in recess region 26. A gate polysilicon layer (not shown), a tungsten layer (not shown), and a gate hard mask layer (not shown) are sequentially formed over semiconductor substrate 20 and in recess region 26. The gate hard mask layer, the tungsten layer, and the gate polysilicon layer are patterned by a photolithography process with a gate mask.

In the waved mask pattern, the difference between the CD of the waved portion and that of the other portion is typically about 15 nm. On a wafer, the difference between the CD of a recess region transferred from the waved portion of recess region 26 and that of the recess region transferred from the remaining portion of recess region 26 is less than 15 nm. The waved recess region may obtain a margin of about 4 nm between the recess region and the edge of the active region near the waved recess region. However, the edge of the active region may not be damaged, which causes a degraded refresh characteristic of the semiconductor device.

FIG. 4 is a layout illustrating an exposure mask according to another embodiment consistent with the invention. Exposure mask 120 includes an active region 123, a device isolation region 125 and a recess gate pattern region 127 including a plurality of gate lines. Recess gate pattern region 127 includes a first portion 127a having a first critical dimension ("CD") D1 and a second portion 127b having a second CD D2. Second portion 127b is disposed between two neighboring active regions 123. In second portion 127b, recess gate pattern region 127 is separated by t, where 0<t<r/5F, and F is a distance between two neighboring gate lines. A second CD D2 is smaller than first CD D1, where D1/10<D2<3/4D1. For example, when first CD D1 ranges from about 20 nm to 40 nm, second CD D2 ranges from about 6 nm to 26 nm.

Figure 5:
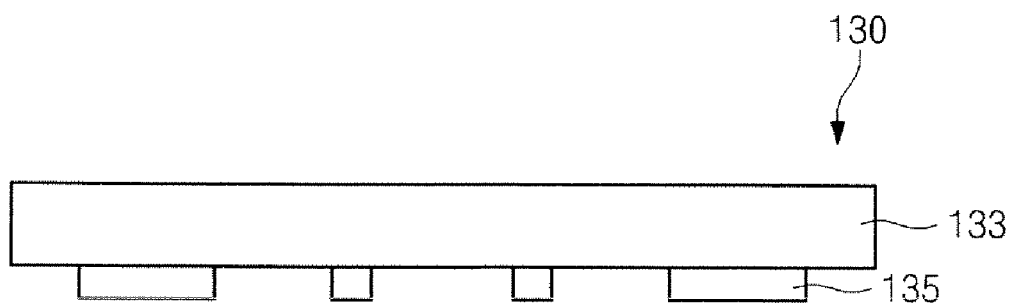
FIG. 5 is a cross-sectional view illustrating an exposure mask according to an embodiment consistent with invention.

FIG. 5 is a cross-sectional view illustrating an exposure mask according to an embodiment consistent with the invention, wherein FIG. 5 is taken along I-I' of FIG. 4. Exposure mask 130 includes a transparent substrate 133 and a recess gate pattern 135 disposed over transparent substrate 133. Recess gate pattern 135 corresponds to recess gate pattern region 127 of FIG. 4.

Figure 6A:
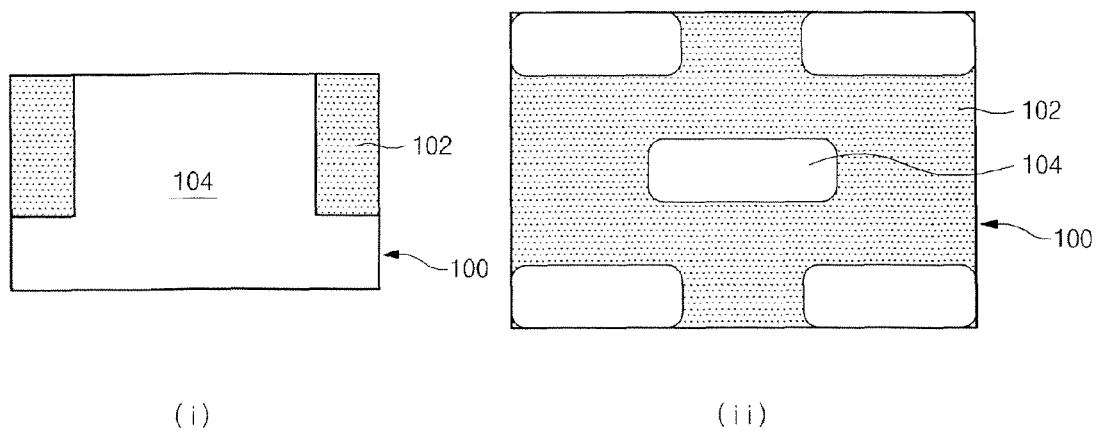
FIGS. 6a to 6e are views illustrating a method for fabricating a semiconductor device according to an embodiment consistent with the invention.
Figure 6B:
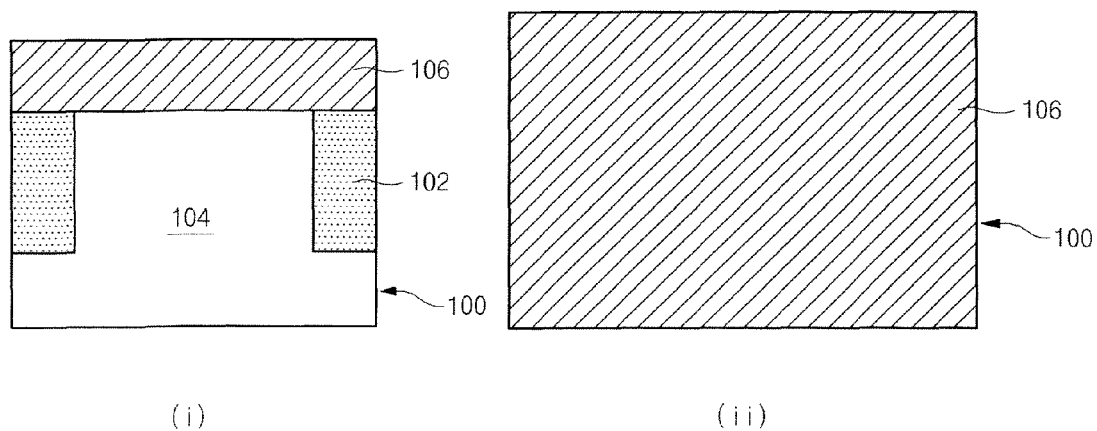

FIGS. 6a to 6e are views illustrating a method for fabricating a semiconductor device according to an embodiment consistent with the invention. FIGS. 6a(i) to 6e(i) are cross-sectional views illustrating the method, and FIGS. 6a(ii) to 6e(ii) are top views illustrating the method. A pad oxide film (not shown) and a pad nitride film (not shown) are formed over a semiconductor substrate 100. The pad nitride film, the pad oxide film, and a portion of semiconductor substrate 100 are etched by a shallow trench isolation ("STI") method, to form a trench for device isolation (not shown). A device isolation oxide film is formed over the trench for device isolation. A planarization process is performed on the device isolation oxide film until the pad nitride film is exposed, thereby forming a device isolation structure 102 that defines an active region 104. The pad nitride film and the pad oxide film are then removed. A hard mask layer 106 is formed over semiconductor substrate 100. In one embodiment, hard mask layer 106 preferably includes a polysilicon layer.

Figure 6C:
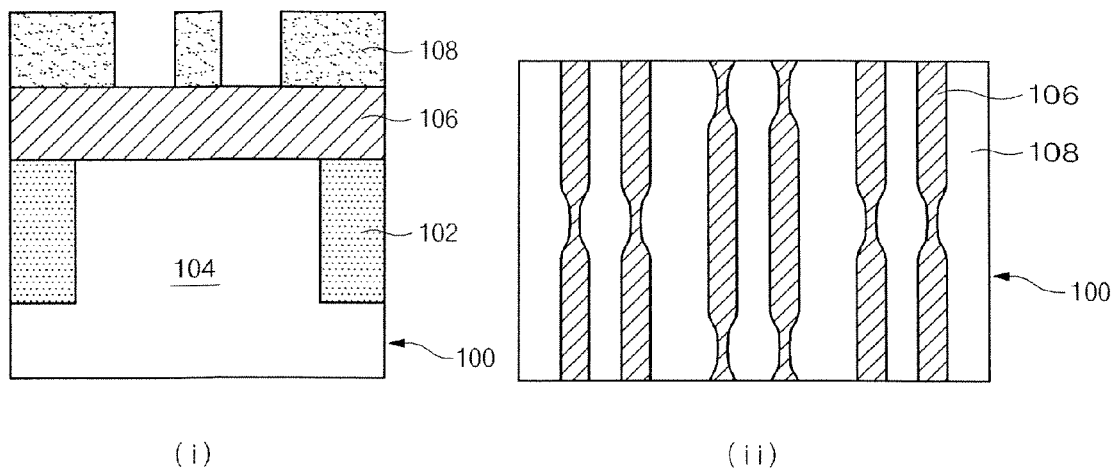

Referring to FIG. 6c, a photoresist film is formed over hard mask layer 106. The photoresist film is exposed and developed with an exposure mask to form a photoresist pattern 108 that defines recess gate pattern region 127 (see FIG. 4). The process of exposing photoresist pattern 108 preferably is performed using a dipole polarized illuminator in order to have a uniform CD. A light source of the exposing process is preferably selected from the group consisting of KrF (248 nm) lasers, ArF (193 nm) lasers, $F_2$ (157 nm) lasers, and electron beams.

Figure 6D:
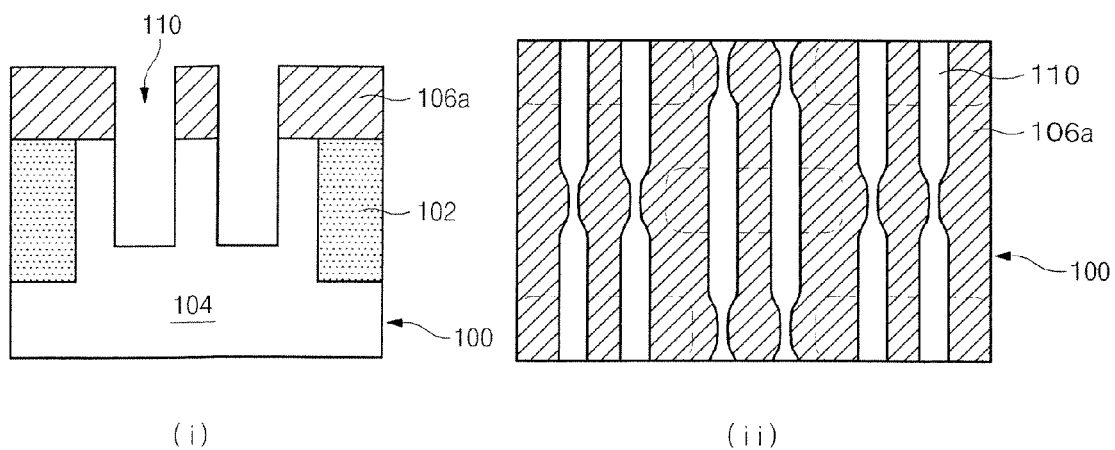

Referring to FIG. 6d, hard mask layer 106 is etched using photoresist pattern 108 as a mask to form a hard mask pattern 106a. Photoresist pattern 108 is then removed. A portion of semiconductor substrate 100 is etched using hard mask pattern 106a to form a recess region 110. Recess region 110 is formed to have a wave type with a different CD. The etched amount of device isolation structure 102 is reduced in the edge of active region 104 to prevent damage in the edge of active region 104.

Figure 6E:
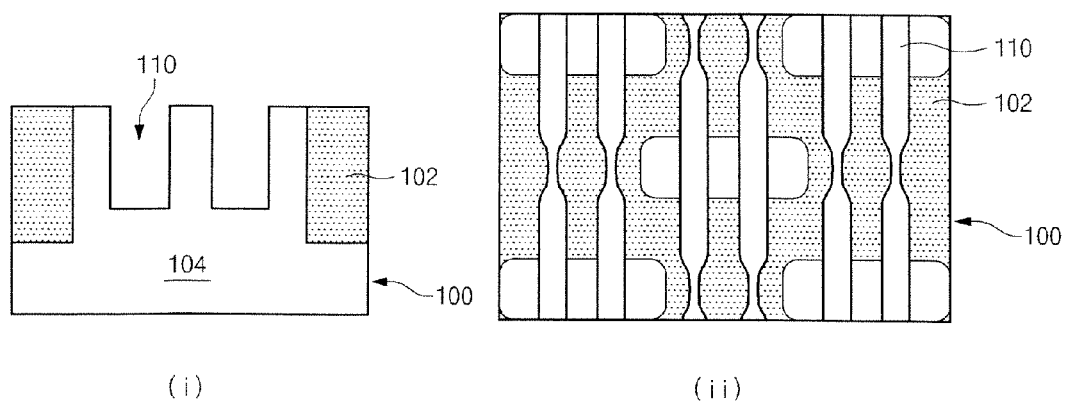

Referring to FIG. 6e, hard mask pattern 106a is removed. A gate oxide film (not shown) is formed in semiconductor substrate 100 and in recess region 110. A gate polysilicon layer (not shown), a tungsten layer (not shown), and a gate hard mask layer (not shown) are sequentially formed over the gate oxide film. The gate hard mask layer, the tungsten layer, and the gate polysilicon layer are patterned preferably by a photolithography process with a gate mask, thereby forming a recess gate (not shown).

Figure 7:
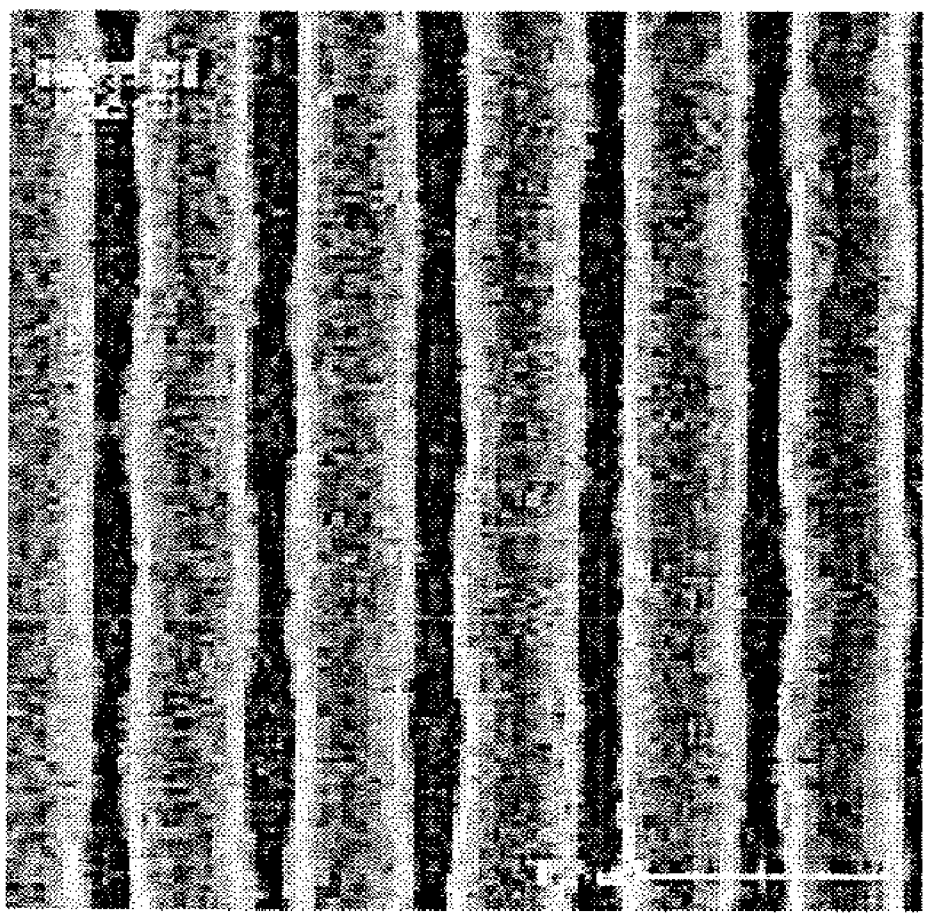
FIG. 7 is an SEM photograph illustrating a recess region formed by a method for fabricating a semiconductor device according to an embodiment consistent with the invention.

FIG. 7 is an SEM photograph illustrating a recess region formed by a method for fabricating a semiconductor device according to an embodiment consistent with the invention. The recess region is formed to have a large wave degree without any damage in the edge of the active region.

As described above, according to an embodiment consistent with invention, an exposure mask for a recess gate is designed so that the CD of the portion near to an edge of an active region is smaller than that of the remaining portion. A semiconductor substrate is etched with the exposure mask so that the edge of the active region and a device isolation structure is not edged, thereby preventing damage in the edge of the active region to improve a refresh characteristic of a semiconductor device. Also, it is easy to inspect the device for defects, thereby shortening the development period of the device.

The above embodiments of the present invention are illustrative and not limiting. Various alternatives and equivalents are possible. The invention is not limited by the type of deposition, etching polishing, and patterning steps described herein. Nor is the invention limited to any specific type of semiconductor device. For example, the invention may be implemented in a dynamic random access memory (DRAM) device or non volatile memory device. Other additions, subtractions, or modifications that are obvious in view of the present disclosure are intended to fall within the scope of the appended claims.

What is claimed is:

1. An exposure mask for forming a plurality of line type recess gates on a semiconductor substrate having a plurality of active regions, comprising:
   a transparent substrate; and
   a plurality of recess gate pattern regions disposed over the transparent substrate, each of the recess gate pattern regions comprising a first portion region having a first line width and a second portion region having a second line width smaller than the first line width,
   wherein the second portion region of the recess gate pattern region is separated from a second portion region of a neighboring recess gate pattern region in a longitudinal direction by a distance t, where 0<t<1/5F and F is a distance between two neighboring line type recess gates.

2. The exposure mask of claim 1, wherein in a longitudinal direction of an active region, the first line width is D1, and the second line width is D2, where D1/10<D2<3/4D1.

3. The exposure mask of claim 1, wherein the second portion is disposed between two neighboring active regions.

4. A method for fabricating a semiconductor device, the method comprising the steps of:
   providing a semiconductor substrate having a device isolation structure defining an active region; and
   selectively etching the semiconductor substrate by using the exposure mask of claim 1 to form a recess regions for the plurality of line type recess gates.

5. An exposure mask for forming a plurality of recess gates on a semiconductor substrate having a plurality of active regions, comprising:
   a plurality of isolated recess gate pattern regions, each gate pattern region comprising a main pattern and an extended pattern connected to each edge part of the main pattern in a longitudinal direction,
wherein the extended pattern is isolated from an extended pattern of a neighboring isolated recess gate pattern region in a longitudinal direction.

6. The exposure mask of claim 5, wherein the extended pattern width is smaller than the isolated recess gate pattern width.

* * * * *